US012690485B2

(12) United States Patent
Hanasaka et al.

(10) Patent No.: US 12,690,485 B2
(45) Date of Patent: Jul. 21, 2026

(54) SEMICONDUCTOR DEVICE MANUFACTURING METHOD AND LEAD FRAME

(71) Applicant: TOWA CORPORATION, Kyoto (JP)

(72) Inventors: Syuho Hanasaka, Kyoto (JP); Naomi Fujiwara, Kyoto (JP); Yudai Takamori, Kyoto (JP); Yoshito Nakamura, Kyoto (JP); Kanji Ishibashi, Kyoto (JP); Saori Isono, Kyoto (JP)

(73) Assignee: TOWA CORPORATION, Kyoto (JP)

( * ) Notice: Subject to any disclaimer, the term of this patent is extended or adjusted under 35 U.S.C. 154(b) by 374 days.

(21) Appl. No.: 18/683,264

(22) PCT Filed: Jun. 14, 2022

(86) PCT No.: PCT/JP2022/023773
§ 371 (c)(1),
(2) Date: Feb. 13, 2024

(87) PCT Pub. No.: WO2023/037682
PCT Pub. Date: Mar. 16, 2023

(65) Prior Publication Data
US 2024/0371658 A1 Nov. 7, 2024

(30) Foreign Application Priority Data

Sep. 8, 2021 (JP) ................................. 2021-146352

(51) Int. Cl.
*H10W 90/00* (2026.01)
*B23K 26/38* (2014.01)
(Continued)

(52) U.S. Cl.
CPC ........... *H10W 74/014* (2026.01); *B23K 26/38* (2013.01); *H10W 70/048* (2026.01);
(Continued)

(58) Field of Classification Search
CPC ............. H10W 74/014; H10W 70/048; H10W 70/421; H10W 74/111; H10W 90/756;
(Continued)

(56) References Cited

U.S. PATENT DOCUMENTS 6,452,255 B1 * 9/2002 Bayan .................. H10W 74/111
438/123
11,024,563 B2 * 6/2021 Tsukagoshi ......... H10W 70/048
(Continued)

FOREIGN PATENT DOCUMENTS

CN 102479767 A 5/2012
EP 2953160 A2 12/2015
(Continued)

OTHER PUBLICATIONS

Notice of Allowance mailed Mar. 1, 2023 for counterpart Taiwanese Application No. 111128828.

*Primary Examiner* — David Vu
(74) *Attorney, Agent, or Firm* — Faegre Drinker Biddle & Reath LLP

(57) ABSTRACT

A lead frame has a back surface having a multiple-irradiated region that is irradiated with laser light scanned in a first scan step and laser light scanned in a second scan step, a unit resin molded product that is formed in a cutting step has corner regions overlapping the multiple-irradiated region of the lead frame, and the multiple-irradiated region prevents the laser light emitted to the back surface from reaching portions of the resin material on the front surface of the lead frame, the portions being located at a position corresponding to the corner regions.

6 Claims, 7 Drawing Sheets

(51) Int. Cl.

| | | |
|---|---|---|
| *H10W 70/04* | (2026.01) | |
| *H10W 70/40* | (2026.01) | |
| *H10W 74/01* | (2026.01) | |
| *H10W 74/10* | (2026.01) | |

(52) U.S. Cl.
CPC ........ *H10W 70/421* (2026.01); *H10W 74/111* (2026.01); *H10W 90/756* (2026.01)

(58) Field of Classification Search
CPC ........... H10W 72/0198; H10W 72/073; H10W 72/075; H10W 72/884; H10W 90/736; H10W 70/424; H10W 70/457; H10W 74/019; H10W 74/127; B23K 26/38; H10P 54/00

See application file for complete search history.

(56) References Cited

U.S. PATENT DOCUMENTS

| | | |
|---|---|---|
| 2012/0126378 A1 | 5/2012 | San Antonio et al. |
| 2013/0277817 A1 | 10/2013 | Takeuchi |

FOREIGN PATENT DOCUMENTS

| | | |
|---|---|---|
| JP | 2010-004080 A | 1/2010 |
| JP | 2011-077278 A | 4/2011 |
| JP | 2014-007287 A | 1/2014 |
| JP | 2014-187308 A | 10/2014 |
| JP | 2020-188186 A | 11/2020 |
| TW | 202044420 A | 12/2020 |

* cited by examiner

SEMICONDUCTOR DEVICE MANUFACTURING METHOD AND LEAD FRAME

TECHNICAL FIELD

The description relates to a semiconductor device manu-facturing method and a lead frame.

BACKGROUND ART

A so-called non-lead semiconductor device, such as a quad flat non-leaded package (QFN), is known, as disclosed in PTL 1 below. The semiconductor device disclosed in PTL 1 includes a lead frame that has a recess formed in the lead portion of a surface opposite a chip-mounting surface. PTL 1 (paragraph [0063]) discloses that the sealing resin filled in the recess can be removed by irradiating the recess with laser light.

CITATION LIST

Patent Literature

PTL 1: Japanese Patent Laying-Open No. 2011-077278

SUMMARY OF INVENTION

Technical Problem

Assume that a lead frame has first grooves extending in a first direction and second grooves extending in a second direction intersecting with (e.g., orthogonal to) the first direction. Furthermore, assume that the laser light is scanned in the first direction along the first grooves to remove the resin materials from the first grooves, and the laser light is scanned in the second direction along the second grooves to remove the resin materials from the second grooves.

Unless a specific control is performed over the laser light irradiation operation for removing the resin materials from the first grooves and the resin materials from the second grooves, the area where the first groove and the second groove intersect is irradiated with the laser light in an overlapping manner. If the area where the first groove and the second groove intersect corresponds to a corner region of a semiconductor device as an end product, the corner region, subjected to the overlapping irradiation of the laser light, may not be formed in a desired manner or may be prone to damage.

An object of the description is to disclose a semiconductor device manufacturing method and a lead frame that can prevent degradation in quality of the corner regions of a semiconductor device as an end product even if the area where the first groove and the second groove intersect is irradiated with the laser light in an overlapping manner.

Solution to Problem

A semiconductor device manufacturing method according to the present disclosure includes: a preparation step of preparing a lead frame having a front surface on which a semiconductor chip is mounted, and a back surface opposite the front surface, the back surface having a first groove extending in a first direction and a second groove extending in a second direction intersecting with the first direction; a molding step of forming a resin molded product by sealing the lead frame and a plurality of semiconductor chips mounted on the lead frame with a resin material; a first scan step of removing the resin material from the first groove by scanning laser light over the first groove in the first direction; a second scan step of removing the resin material from the second groove by scanning laser light over the second groove in the second direction; and a cutting step of forming a plurality of unit resin molded products by cutting and singulating the resin molded product along the first groove and the second groove, wherein when the back surface of the lead frame is viewed in a direction perpendicular to the back surface, the back surface of the lead frame has a multiple-irradiated region that is irradiated with laser light scanned in the first scan step and laser light scanned in the second scan step, at least one of the plurality of unit resin molded products, formed in the cutting step, has a corner region located overlapping the multiple-irradiated region of the lead frame, and the multiple-irradiated region of the lead frame prevents laser light emitted to the back surface from reaching a portion of the resin material on the front surface of the lead frame, the portion being located at a position corresponding to the corner region.

A lead frame according to the present disclosure has: a front surface on which a semiconductor chip is mounted; a back surface opposite the front surface, the back surface having a first groove extending in a first direction and a second groove extending in a second direction intersecting with the first direction, wherein the lead frame, together with a plurality of semiconductor chips mounted on the lead frame, is sealed with a resin material to form a resin molded product, the resin material is removed from the first groove by scanning laser light over the first groove in the first direction, the resin material is removed from the second groove by scanning laser light over the second groove in the second direction, and a plurality of unit resin molded prod-ucts are formed by cutting and singulating the resin molded product along the first groove and the second groove, wherein when the back surface of the lead frame is viewed in a direction perpendicular to the back surface, the back surface has a multiple-irradiated region that is irradiated with laser light when the resin material is removed from the first groove by scanning laser light over the first groove along the first direction, and when the resin material is removed from the second groove by scanning laser light over the second groove along the second direction, wherein each of the plurality of unit resin molded products has a corner region located overlapping the multiple-irradiated region of the lead frame, and the multiple-irradiated region of the lead frame prevents laser light emitted to the back surface from reaching a portion of the resin material on the front surface of the lead frame, the portion corresponding to the corner region.

Advantageous Effects of Invention

According to the above configuration, the semiconductor device manufacturing method and the lead frame can be obtained, which can prevent degradation in quality of the corner regions of a semiconductor device as an end product even if the area where the first groove and the second groove intersect is irradiated with the laser light in an overlapping manner.

DESCRIPTION OF EMBODIMENTS

In the following, embodiments will be described, with reference to the accompanying drawings. In the following description, like reference number refers to like parts and corresponding parts, and no redundant descriptions may be repeated. In the following, a configuration of a lead frame 1 according to an embodiment is described first and then a semiconductor device manufacturing method according to the embodiment will be described.

[Lead Frame 1]

Figure 1:
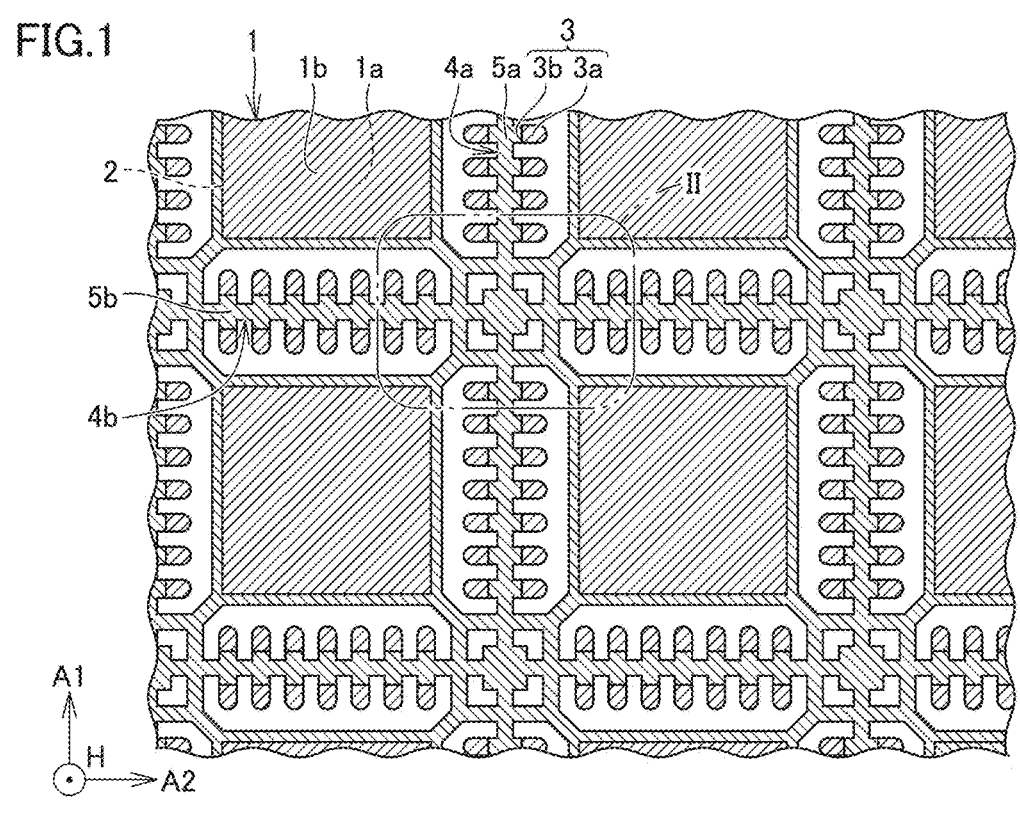
FIG. 1 is a plan view showing a configuration of a back surface 1b of a lead frame 1, according to an embodiment.
Figure 2:
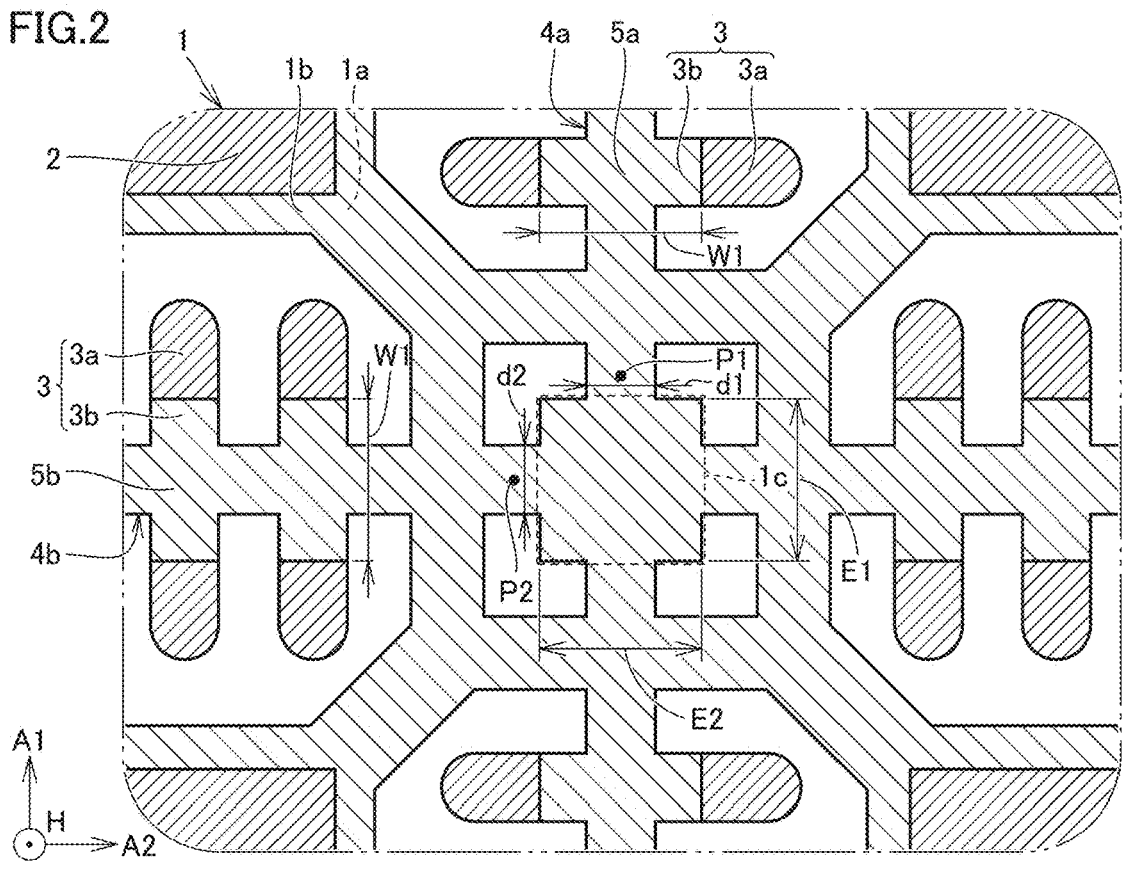
FIG. 2 is an enlarged plan view of a region demarcated by II line of FIG. 1.
Figure 3:
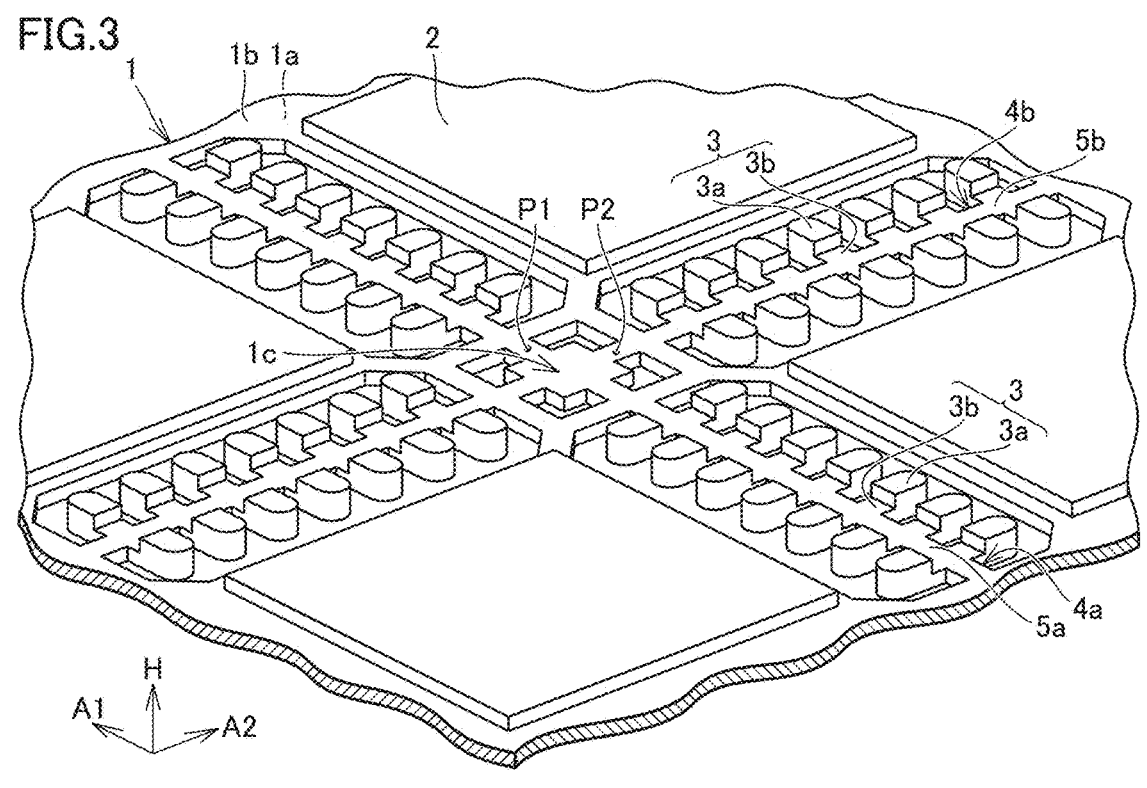
FIG. 3 is a perspective view of the back surface 1*b* of the lead frame 1, according to the embodiment.

FIG. 1 is a plan view showing a configuration of a back surface 1*b* of a lead frame 1. FIG. 2 is an enlarged plan view of a region demarcated by II line of FIG. 1. FIG. 3 is a perspective view showing a configuration of the back surface 1*b* of the lead frame 1.

While FIGS. 1 and 2 do not show a cross-sectional configuration of the lead frame 1, the elements constituting the lead frame 1 are shown in diagonal hatch patterns, for convenience of illustration. Here, two types of hatch lines are used, differences therebetween will be described below. FIGS. 1 to 3 show a first direction A1, a second direction A2 intersecting with (here, as one example, orthogonal to) the first direction A1, and a thickness direction H intersecting with (here, as one example, orthogonal to) the first direction A1 and the second direction A2. In the following description, these directions will be referred to, as appropriate.

As shown in FIGS. 1 to 3, the lead frame 1 has a generally plate shape extending in the first direction A1 and the second direction A2. The lead frame 1 has a front surface 1*a* on which a semiconductor chip 6 (FIGS. 5 and 6) is mounted, and a back surface 1*b* opposite the front surface 1*a*. The lead frame 1 is formed of metal, such as copper. The lead frame 1 includes multiple die pads 2, multiple lead portions 3, multiple tie bar portions 4*a* (first tie bar portions), and multiple tie bar portions 4*b* (second tie bar portions).

(Die Pad 2, Lead Portion 3, Tie Bar Portions 4*a* and 4*b*)

The die pads 2 are arranged spaced from each other in the first direction A1 and the second direction A2. The die pad 2 is an area where a semiconductor chip 6 is mounted on the front surface 1*a* of the die pad 2 (see FIG. 6). As shown in FIG. 1, the lead portions 3 are arranged in a rectangular shape around (four sides of) each of the die pads 2. Each of the lead portions 3 has a thicker portion 3*a* and a thinner portion 3*b* (FIGS. 2 and 3).

Tie bar portions 4*a* and 4*b* are arranged in a grid shape surrounding each of the die pads 2. The tie bar portion 4*a* extends substantially in parallel with the first direction A1. The tie bar portion 4*b* extends substantially in parallel with the second direction A2. The respective thicker portions 3*a* of the lead portions 3 arranged along the first direction A1 are coupled to the tie bar portions 4*a* via the thinner portions 3*b*. The respective thicker portions 3*a* of the lead portions 3 arranged along the second direction A2 are coupled to the tie bar portions 4*b* via the thinner portions 3*b*.

In the thickness direction H, the die pad 2 and the thicker portion 3*a* are thicker than the thinner portion 3*b*. The die pads 2 and the thicker portions 3*a* are hatched with lines extending from the upper right side of the pages as shown in FIGS. 1 and 2 to the lower left side. The thinner portions 3*b* are hatched with lines extending from the upper left side of the pages as shown in FIGS. 1 and 2 to the lower right side. Here, the thinner portions 3*b* of the lead portions 3 and the tie bar portions 4*a* and 4*b* have the same thickness, and the thinner portions 3*b* of the lead portions 3 and the tie bar portions 4*a* and 4*b* are hatched with lines extending from the upper left side of the pages as shown in FIGS. 1 and 2 to the lower right side.

(First Groove 5*a*, Second Groove 5*b*)

Referring to FIG. 2, a position in a direction orthogonal to the back surface 1*b* of the lead frame 1 (corresponding to the thickness direction H) is defined as a "height position." The height positions of the back surfaces 1*b* of the tie bar portions 4*a* and 4*b* are the same as the height position of the back surface 1*b* of the thinner portion 3*b* of the lead portion 3. In contrast, the height position of the back surface 1*b* of the thicker portion 3*a* of the lead portion 3 is higher than the height positions of the back surfaces 1*b* of the tie bar portions 4*a* and 4*b* and the height position of the back surface 1*b* of the thinner portion 3*b* of the lead portion 3.

In other words, the back surfaces 1*b* of the tie bar portions 4*a* and 4*b* and the back surface 1*b* of the thinner portion 3*b* of the lead portion 3 are each recessed relative to the back surface 1b of the thicker portion 3a of the lead portion 3. This structure, in the lead frame 1, allows a first groove 5a extending along the first direction A1 to be formed in the back surface 1b of the tie bar portion 4a, and a second groove 5b extending along the second direction A2 to be formed in the back surface 1b of the tie bar portion 4b. The first groove 5a and the second groove 5b intersect with each other. The first groove 5a and the second groove 5b are formed in a surface opposite the surface of the lead frame 1 on which the semiconductor chip 6 is formed, that is, in the back surface 1b.

The first groove 5a and the second groove 5b do not pass through the lead frame 1 in the thickness direction H, but they each have a groove depth that is, for example, half the thickness of the lead frame 1. The first groove 5a and the second groove 5b can be formed by etching (wet etching) the lead frame 1. The first groove 5a and the second groove 5b each have a groove width W1 (FIG. 2). The groove width W1 is, for example, 0.40 mm to 0.50 mm. The groove width W1 of the first groove 5a and the groove width W1 of the second groove 5b may be the same or different. The groove width W1 and the groove depth may be set in view of ensuring their strengths to an extent that causes no defect such as deformation in a later step, performing good visual inspection in a later step, and a good mounting strength of the semiconductor device as an end product.

(Scan Region R1, Scan Region R2, Multiple-Irradiated Region 1c)

Figure 4:
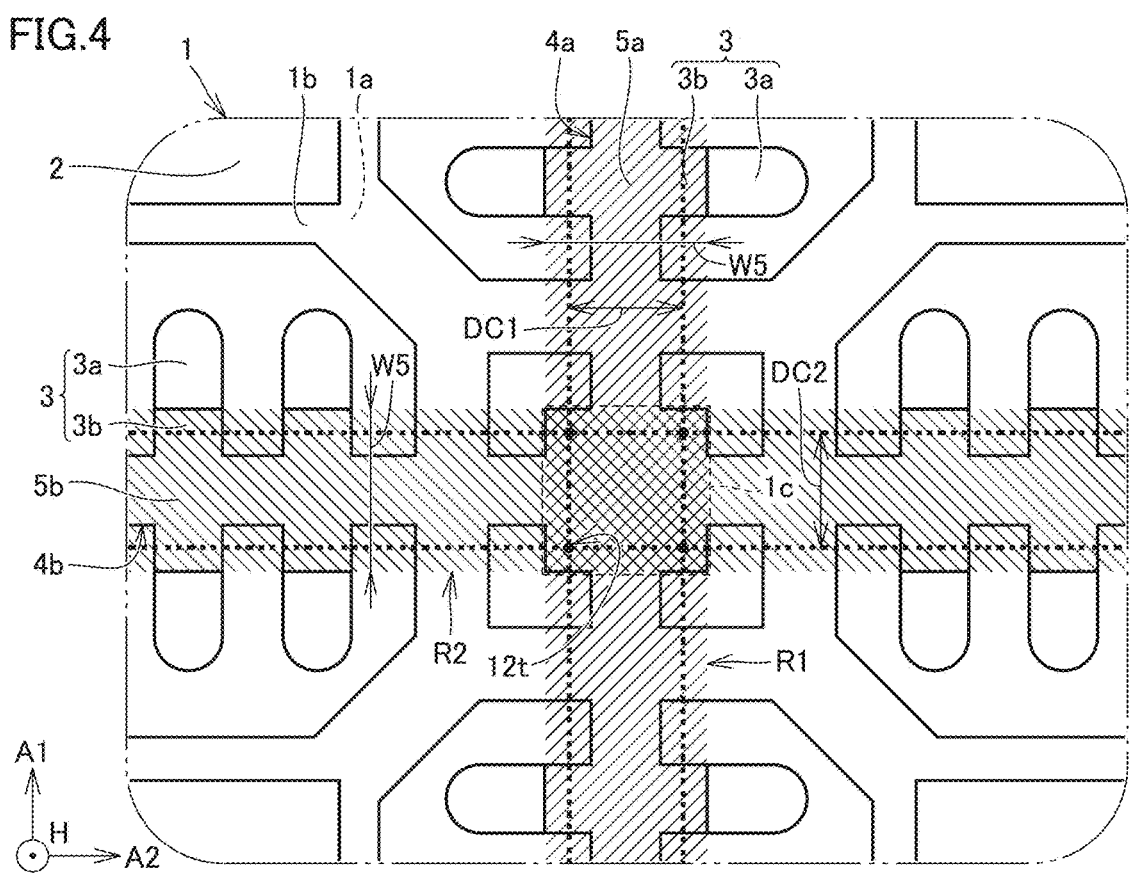
FIG. 4 is a plan view of a configuration of the back surface 1*b* of the lead frame 1, according the embodiment, showing scan regions R1 and R2 for laser light and score lines DC1 and DC2.

FIG. 4 is a plan view of a configuration of the back surface 1b of the lead frame 1, showing scan regions R1 and R2 for the laser light and score lines DC1 and DC2. As shown in FIGS. 2 and 4, the lead frame 1 has a multiple-irradiated region 1c.

As described below in detail, the semiconductor device manufacturing method according to the embodiment includes a molding step, a first scan step, and a second scan step. In the molding step, the lead frame 1 and the semiconductor chips 6 mounted on the lead frame 1 are sealed with a resin material 9 (see FIGS. 6 and 7), and a resin molded product 11 is thereby formed.

In the first scan step (see FIGS. 4, 9, and 10), laser light L2 (FIG. 10) is scanned over the first groove 5a of the resin molded product 11 along the first direction A1, and the resin material 9 is thereby removed from the first groove 5a. The region of the back surface 1b of the lead frame 1 that is irradiated with the laser light L2 in the first scan step is the scan region R1 (FIG. 4). The scan region R1 extends in a band shape along the first direction A1, as shown in FIG. 4. For convenience of illustration, in FIG. 4, the scan region R1 is hatched with lines extending from the upper right side of the page as shown in FIG. 4 to the lower left side. The scan region R1 has a width W5 corresponding to the groove width W1 (FIG. 2) of the first groove 5a.

Similarly, in the second scan step (see FIGS. 4 and 10), laser light L3 (FIG. 10) is scanned over the second groove 5b of the resin molded product 11 along the second direction A2, and the resin material 9 is thereby removed from the second groove 5b. The scan region R2 (FIG. 4) refers to the region of the back surface 1b of the lead frame 1, which is irradiated with the laser light L3 in the second scan step, and the scan region R2 extends in a band shape along the second direction A2, as shown in FIG. 4. For convenience of illustration, in FIG. 4, the scan region R2 is hatched with lines extending from the upper left side of the page of FIG. 4 to the lower right side. The scan region R2 has the width W5 corresponding to the groove width W1 (FIG. 2) of the second groove 5b.

The multiple-irradiated region 1c is defined as follows. More specifically, the multiple-irradiated region 1c is a region of the back surface 1b of the lead frame 1, where the laser light L2 (FIG. 10) scanned in the first scan step is irradiated with and the laser light L3 (FIG. 10) scanned in the second scan step is irradiated, when the back surface 1b of the lead frame 1 is viewed in a direction perpendicular to the back surface 1b. Stated differently, the multiple-irradiated region 1c is the region of the lead frame 1 where the scan regions R1 and R2 overlap. Here, the multiple-irradiated region 1c (see FIGS. 2 and 4) is provided at a location where the tie bar portion 4a and the tie bar portion 4b intersect with each other.

As shown in FIG. 2, here, the multiple-irradiated region 1c has a rectangular shape. The multiple-irradiated region 1c has a width E2 in the second direction A2 which is greater than a width d1 (FIG. 2), in the second direction A2, of a portion P1 (FIGS. 2 and 3) of the tie bar portion 4a that is connected to the multiple-irradiated region 1c. Likewise, the multiple-irradiated region 1c has a width E1 in the first direction A1 which is greater than a width d2 (FIG. 2), in the first direction A1, of a portion P2 (FIGS. 2 and 3) of the tie bar portion 4b that is connected to the multiple-irradiated region 1c. Furthermore, the multiple-irradiated region 1c is allowed to function more reliably as a shielding mask for corner regions 12t if the width E1 or the width E2 is made equal to or greater than the groove widths W1 (FIG. 2) of the first groove 5a and the second groove 5b.

(Score Lines DC1 and DC2, Corner Region 12t)

As described below in detail, the semiconductor device manufacturing method according to the embodiment further includes a cutting step (see FIG. 12). The resin molded product 11 is cut and singulated along the first groove 5a and the second groove 5b, and unit resin molded products (semiconductor devices 12) are thereby formed.

In FIG. 4, the score line DC1 depicts the region that is cut (removed) from the lead frame 1 when the resin molded product 11 is cut along the first groove 5a. The score line DC2 depicts the region that is cut (removed) from the lead frame 1 when the resin molded product 11 is cut along the second groove 5b. The score lines DC1 and DC2 each extend in a band shape within the lead frame 1.

Figure 12:
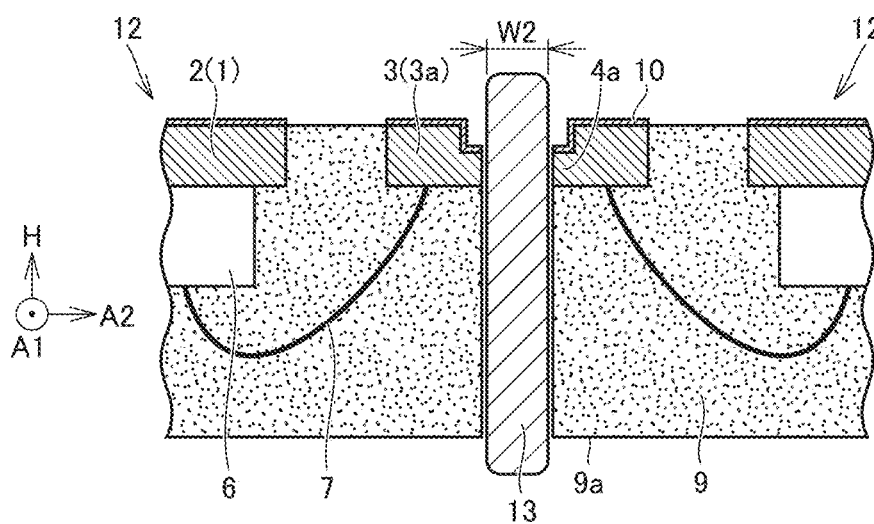
FIG. 12 is a diagram showing the cross section during a cutting step of the semiconductor device manufacturing method according to the embodiment.

In the cutting step, for example, a portion of the lead frame 1 having the total thickness and a portion of the resin material 9 having the total thickness are cut with the blade 13 having a width W2 (FIG. 12). The width W2 (subsequently the same as the widths of the score lines DC1 and DC2) of the blade 13 is less than the groove widths W1 (FIG. 2) of the first groove 5a and the second groove 5b. The unit resin molded products (the semiconductor devices 12) are obtained by cutting and singulating the resin molded product 11. Each unit resin molded product has the corner regions 12t (see FIGS. 4 and 13) at the locations where the score lines DC1 and DC2 intersect with each other. The corner regions 12t of the unit resin molded products (the semiconductor devices 12) are formed between the side surfaces connected to each other within the unit resin molded products.

Referring to FIG. 4, in the lead frame 1 according to the present embodiment, the multiple-irradiated region 1c is provided overlapping the corner regions 12t (portions to be the corner regions 12t) when the back surface 1b of the lead frame 1 is viewed in a direction perpendicular to the back surface 1b. The multiple-irradiated region 1c of the lead frame 1 can prevent the laser light L2 and L3 (FIG. 10) emitted to the back surface 1b from reaching portions of the resin materials 9 on the front surface 1a of the lead frame 1, the portions corresponding to the corner regions 12*t* (the detail will be described below).

[Semiconductor Device Manufacturing Method]

The semiconductor device manufacturing method according to the embodiment includes the preparation step, the molding step, the first scan step, the second scan step, the plating step, and the cutting step.

(Preparation Step)

Figure 5:
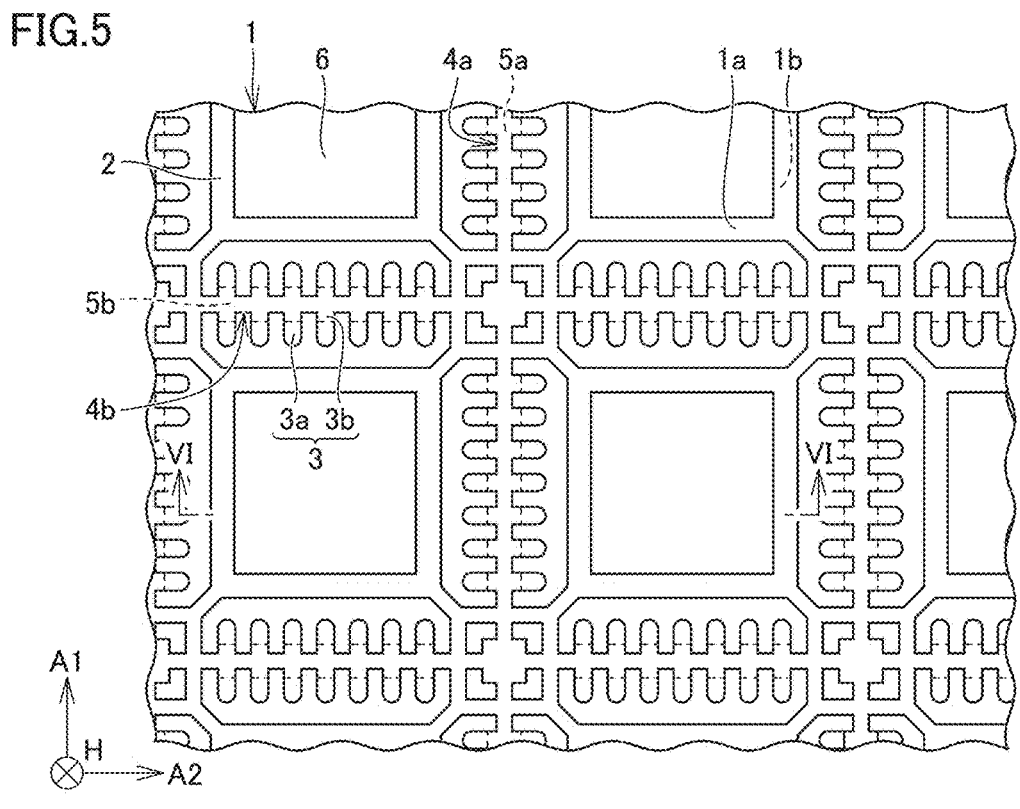
FIG. 5 is a plan view of the lead frame 1 and multiple semiconductor chips 6 on a front surface 1*a* of the lead frame 1, which are prepared in a preparation step of a semiconductor device manufacturing method according to the embodiment.
Figure 6:
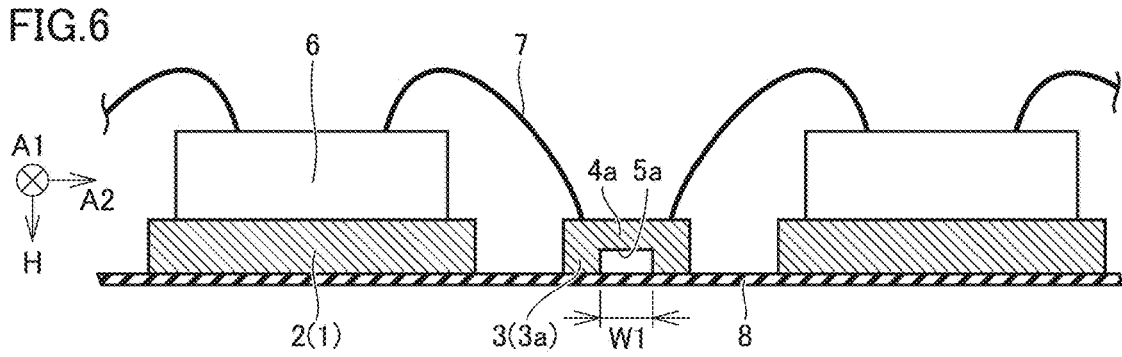
FIG. 6 is a cross-sectional arrow view of the lead frame 1 along VI-VI line of FIG. 5, showing the semiconductor chips 6 being bonded on die pads 2 of the lead frame 1.

FIG. 5 is a plan view of the lead frame 1 and the semiconductor chips 6 on the front surface 1*a*, which are prepared in the preparation step. FIG. 6 is a cross-sectional arrow view of the lead frame 1 along VI-VI line of FIG. 5 in which the semiconductor chips 6 are bonded on the die pads 2 of the lead frame 1. As shown in FIGS. 5 and 6, multiple electrodes included in each semiconductor chip 6 are electrically connected to the lead portion 3 (the thicker portion 3*a*) via bonding wires 7. For convenience, the bonding wires 7 are not shown in FIG. 5.

(Molding Step)

Figure 7:
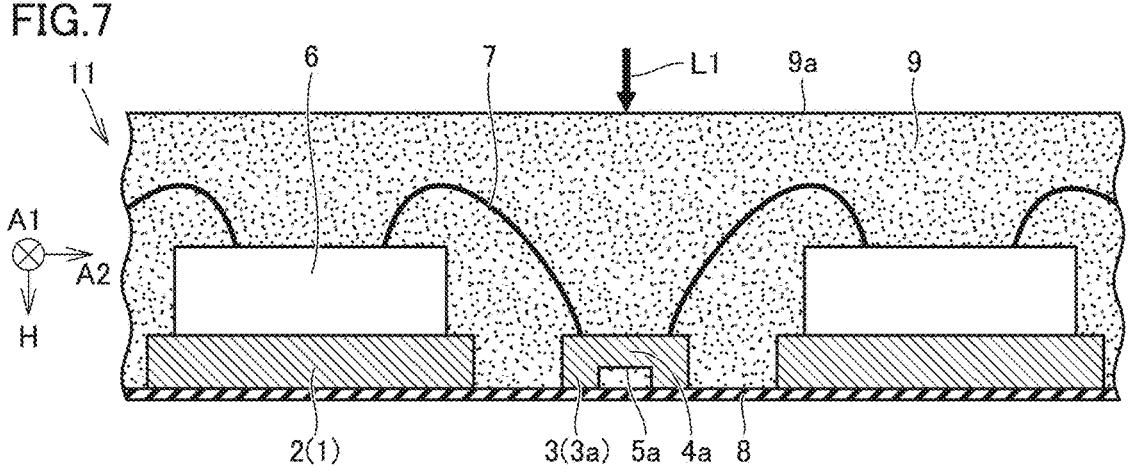
FIG. 7 is a diagram showing the cross section after a molding step of the semiconductor device manufacturing method according to the embodiment.

FIG. 7 is a diagram showing the cross section after the molding step. In the molding step, the lead frame 1 having the semiconductor chip 6 bonded thereon, and the semiconductor chip 6 are sealed with the resin material 9. This results in the resin molded product 11. As shown in FIGS. 6 and 7, prior to the molding step, a protective film 8 (e.g., a polyimide resin tape) may be applied to the surface of the lead frame 1 where the first groove 5*a* and the second groove 5*b* are formed.

The semiconductor device manufacturing method may further include a laser marking step between the molding step and each scan step described next. In the laser marking step, the front surface 9*a* (FIG. 7) of the lead frame 1 of the resin molded product 11, opposite the surface having the first groove 5*a* and the second groove 5*b*, is irradiated with the laser light L1. Any information such as the model or serial number can be represented by scanning pulse laser with a scan optics.

Figure 8:
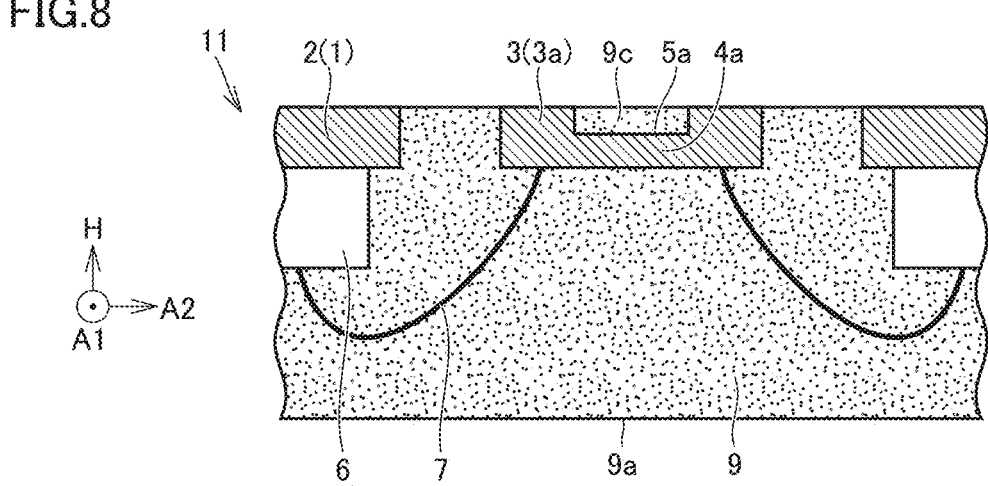
FIG. 8 is a diagram showing the cross section of the lead frame 1 having a protective film removed therefrom, prior to a step of scanning the laser light (a first scan step) of the semiconductor device manufacturing method according to the embodiment.

As shown in FIG. 8, prior to the scan step described next, the protective film 8 is removed from the lead frame 1. The removal of the protective film 8 exposes the first groove 5*a* of the lead frame 1 and the resin material 9 (9*c*) filled in the second groove 5*b*. Note that the protective film 8 may be removed from the lead frame 1 prior to the laser marking step described with reference to FIG. 7.

(First Scan Step, Second Scan Step)

Figure 9:
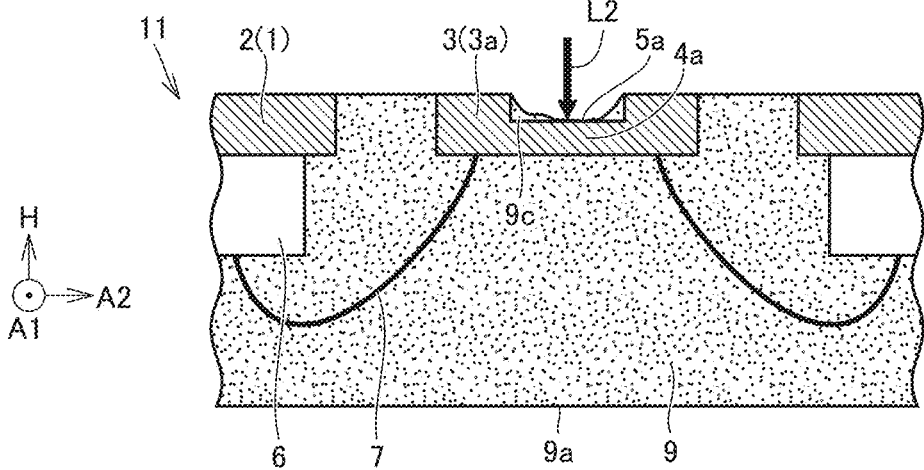
FIG. 9 is a diagram showing the cross section during the first scan step of the semiconductor device manufacturing method according to the embodiment.
Figure 10:
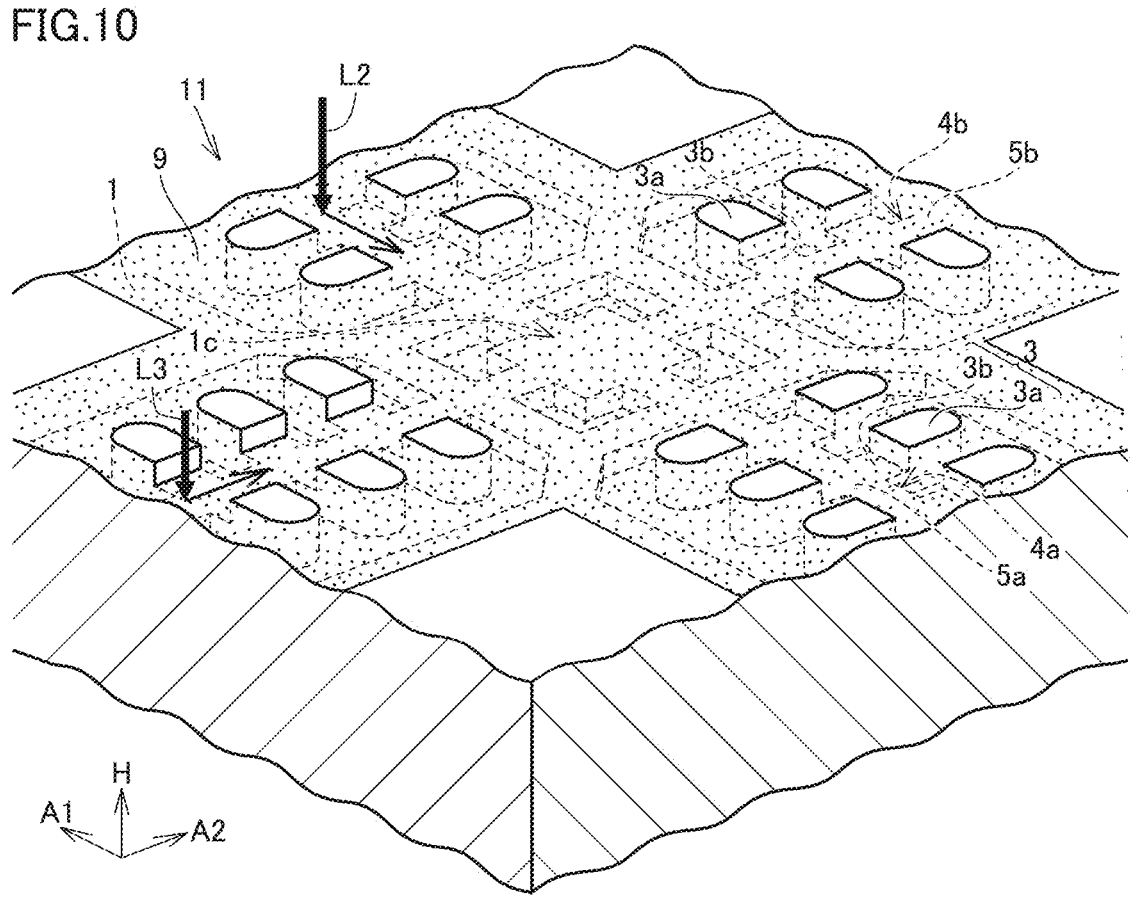
FIG. 10 is a perspective view of the lead frame 1 for illustrating the first scan step and a second scan step of the semiconductor device manufacturing method according to the embodiment.

As shown in FIGS. 9 and 10, in the first scan step, the resin material 9 (9*c*) in the first groove 5*a* is irradiated with the laser light L2 and thereby removed from the first groove 5*a*. The laser light L2 could be provided by pulsed laser such as a YAG laser or an YVO4 laser emitted from a lasing device, or a green laser in which the wavelength of the laser light emitted therefrom is converted by a second harmonic generation (SHG) material. Scanning the laser light L2 with a scan optics can also change the region where the laser light L2 is irradiated.

Depending on a quality of the resin material 9 (9*c*) or a size of the resin material 9 (9*b*) (such as the groove width W1 of the first groove 5*a*), the wavelength, output, laser diameter, irradiation time, etc. of the laser light L2 are optimized so that the resin material 9 (9*b*) can be removed from the groove in an efficient manner. The lasing device for the laser light L2 may be the same as one used for laser marking (FIG. 7). Similarly, as shown in FIG. 10, the second scan step includes irradiating the resin material 9 in the second groove 5*b* with the laser light L3 to remove the resin material 9 from the second groove 5*b*.

At this time, in the lead frame 1 according to the present embodiment, the multiple-irradiated region 1*c* (more specifically, the four corner regions of the multiple-irradiated region 1*c*) overlap the corner regions 12*t* (portions to be the corner regions 12*t*) of the semiconductor device 12 as an end product. The multiple-irradiated region 1*c* functions as a shielding mask for the four corner regions 12*t*. The multiple-irradiated region 1*c* of the lead frame 1 can prevent the laser light L2 and L3 (FIG. 10) emitted to the back surface 1*b* from reaching portions of the resin materials 9 on the front surface 1*a* of the lead frame 1, the portions corresponding to the corner regions 12*t*.

(Plating Step)

Figure 11:
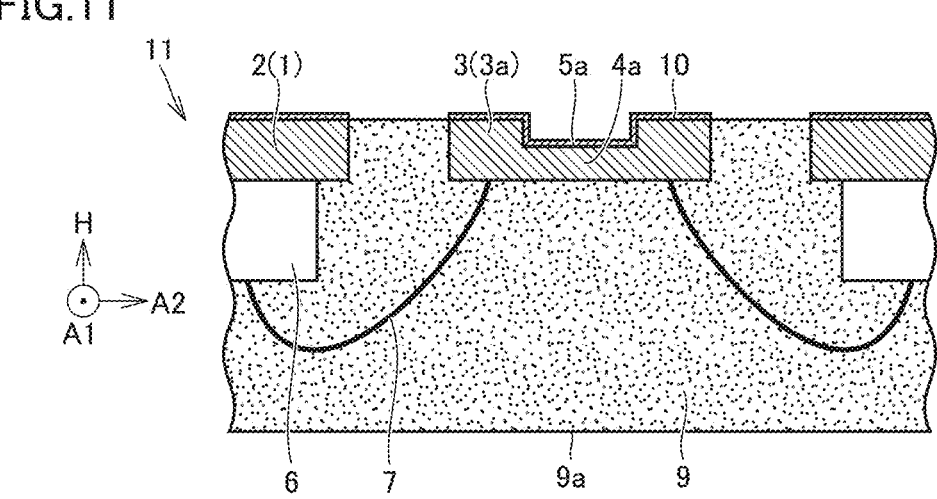
FIG. 11 is a diagram showing the cross section after a plating step of the semiconductor device manufacturing method according to the embodiment.

As shown in FIG. 11, after the resin material is removed from the first groove 5*a* (and the second groove 5*b* not shown in FIG. 11), the lead frame 1 is plated. A plating layer 10 is formed on the die pad 2 of the lead frame 1, the surface of the tie bar portion 4*a* (and the tie bar portion 4*b*) of the lead frame 1, and the surface of the first groove 5*a* (and the second groove 5*b*). Here, a material having good solder wettability can be selected for the plating layer 10, in accordance with a soldering material that is used for implementation. For example, if a Sn (tin)-based solder is used, tin (Sn), tin-copper alloy (Sn—Cu), tin-silver alloy (Sn—Ag), tin-bismuth (Sn—Bi), etc. can be used, and the plating layer 10 can also be formed of a laminate including Ni as an underlying layer that is disposed on the lead frame 1.

In the plating step, a cleaning process may be performed on the lead frame 1 prior to the plating process. As a surface treatment that is conducted on the lead frame 1 in preprocessing of the plating step, removal of an oxide film, surface activation, etc. may be performed, in addition to the cleaning process. The resin materials 9 in the first groove 5*a* and the second groove 5*b* may be reformed (e.g., carbonized) with the irradiation of the laser light. Even if a portion of the resin material 9 is left unremoved, the reformed resin material 9 can be removed from the first groove 5*a* and the second groove 5*b* through the surface treatment such as the cleaning process prior to the plating process.

The laser marking step, described with reference to FIG. 7, may be performed between each scan step and the plating step, alternative to or in addition to between the molding step and the scan step.

(Cutting Step)

As shown in FIG. 12 (and FIG. 4), the lead frame 1 having the plating process applied thereto is cut along the first groove 5*a* and the second groove 5*b*. In the cutting step, the entire thickness of the lead frame 1 and the resin material 9 is cut with the blade 13 having the width W2 (FIG. 12).

Figure 13:
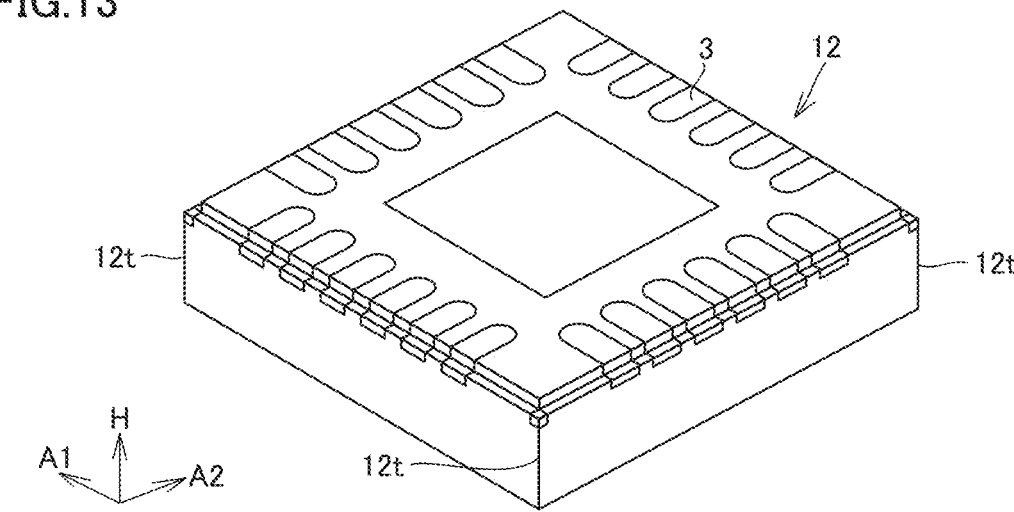
FIG. 13 is a perspective view of a semiconductor device (semiconductor device 12) obtained by a manufacturing method according to the embodiment.

The performance of the cutting step results in the semiconductor devices 12 as multiple unit resin molded products. As shown in FIG. 13, the semiconductor device 12 is a QFN package from which no lead projects outwardly in plan view. Note that while FIG. 13 shows portions of the multiple-irradiated region 1*c* are left unremoved at the corner regions of the semiconductor device 12, these portions of the multiple-irradiated region 1*c* may be removed.

Figure 14:
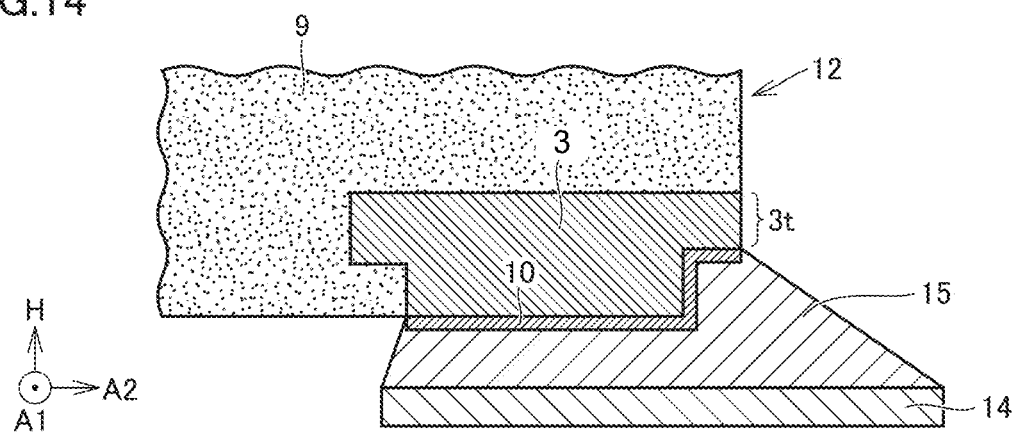
FIG. 14 is a cross-sectional view of a board having mounted thereon the semiconductor device obtained by the manufacturing method according to the embodiment.

As shown in FIG. 14, in the semiconductor device 12, each lead portion 3 has a step on the side portion (shoulder portion), and no plating layer 10 is formed on a side surface 3*t* of the lead portion 3, exposing the original metal of the lead portion 3. The semiconductor device 12 is mounted on a printed circuit board with the resin material 9 side up and the lead portion 3 side down. A land 14 is formed on the printed circuit board at a position corresponding to the lead portion 3, and the lead portion 3 and the land 14 are connected via solder 15.

(Functionality and Advantages)

According to the lead frame 1 of the present embodiment, the multiple-irradiated region 1c overlaps the corner regions 12t (portions to be the corner regions 12t) of the semiconductor device 12 as an end product. The multiple-irradiated region 1c of the lead frame 1 can prevent the laser light L2 and L3 (FIG. 10) emitted to the back surface 1b from reaching portions of the resin materials 9 on the front surface 1a of the lead frame 1, the portions corresponding to the corner regions 12t.

Accordingly, the employment of the lead frame 1 according to the present embodiment can prevent degradation in quality of the corner region 12t of the semiconductor device 12 as an end product, even if the area where the first groove 5a and the second groove 5b of the lead frame 1 intersect is irradiated with the laser light in an overlapping manner.

Moreover, in the lead frame 1 according to the present embodiment, the multiple-irradiated region 1c is thinner than the die pad 2 and the thicker portion 3a. If the multiple-irradiated region 1c and the die pad 2 have the same thickness, since the blade 13 is used in the cutting step which has a width less than the width of the multiple-irradiated region 1c, portions of the multiple-irradiated region 1c are left in a vertically elongated protrusion shape (pillar shape) at the corner regions 12t of the semiconductor devices 12 obtained by the singulation. In contrast, forming the multiple-irradiated region 1c thinner than the die pad 2 and the thicker portion 3a can prevent portions of the multiple-irradiated region 1c from being left in a vertically elongated protrusion shape (pillar shape).

Comparative Example

Figure 15:
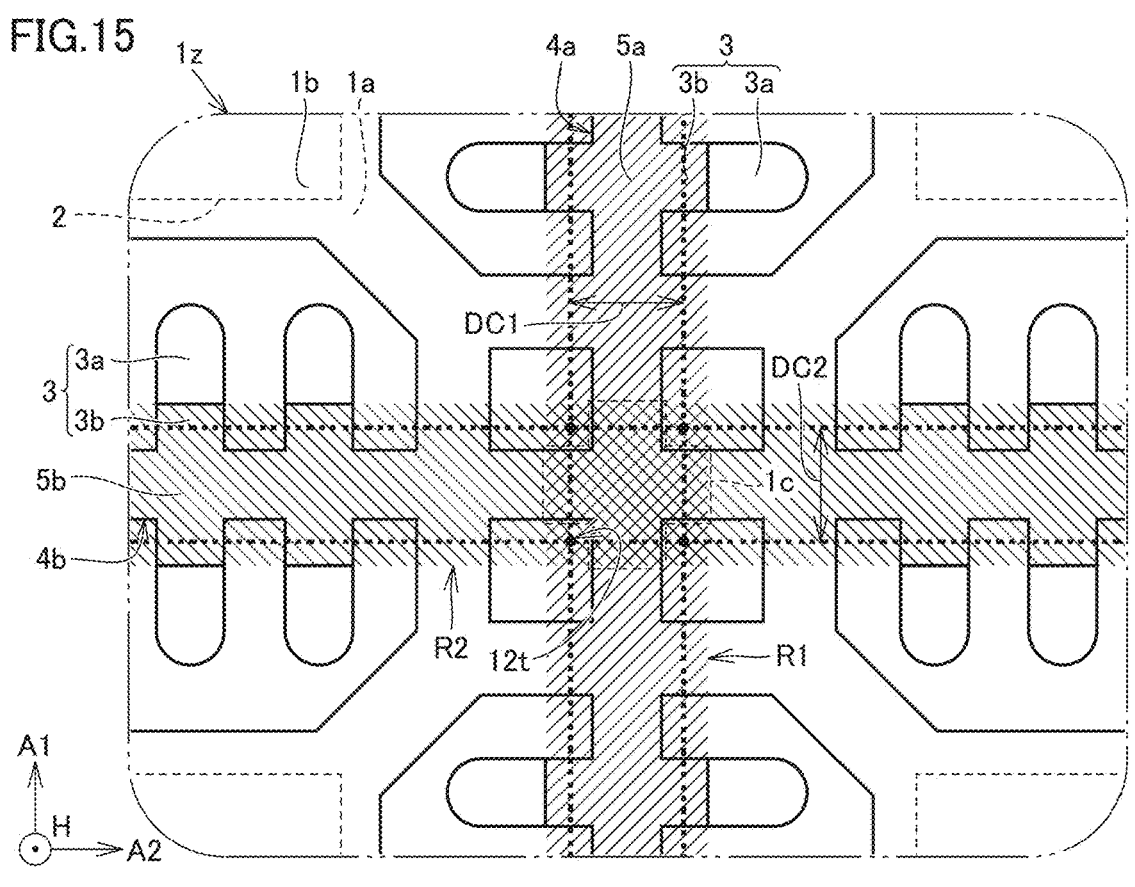
FIG. 15 is a plan view showing a configuration of a back surface 1*b* of a lead frame 1*z* according to Comparative Example, showing scan regions R1 and R2 for laser light and score lines DC1 and DC2.

FIG. 15 is a plan view showing a configuration of a back surface 1b of a lead frame 1z, according to Comparative Example, depicting scan regions R1 and R2 for laser light and score lines DC1 and DC2. The lead frame 1z according to Comparative Example also includes a multiple-irradiated region 1c. However, the multiple-irradiated region 1c of the lead frame 1z has a "cross" shape (or "X" shape) and does not overlap the corner regions 12t (portions to be the corner region 12t) of the semiconductor device 12 as an end product.

The multiple-irradiated region 1c of the lead frame 1z cannot prevent the laser light L2 and L3 (see FIG. 10) emitted to the back surface 1b from reaching portions of the resin materials 9 on the front surface 1a of the lead frame 1z, the portions corresponding to the corner regions 12t. With this configuration, the corner region 12t is affected by the overlapping irradiation with the laser light, and may not be formed in a desired manner or may be prone to damage.

[Variation]

Figure 16:
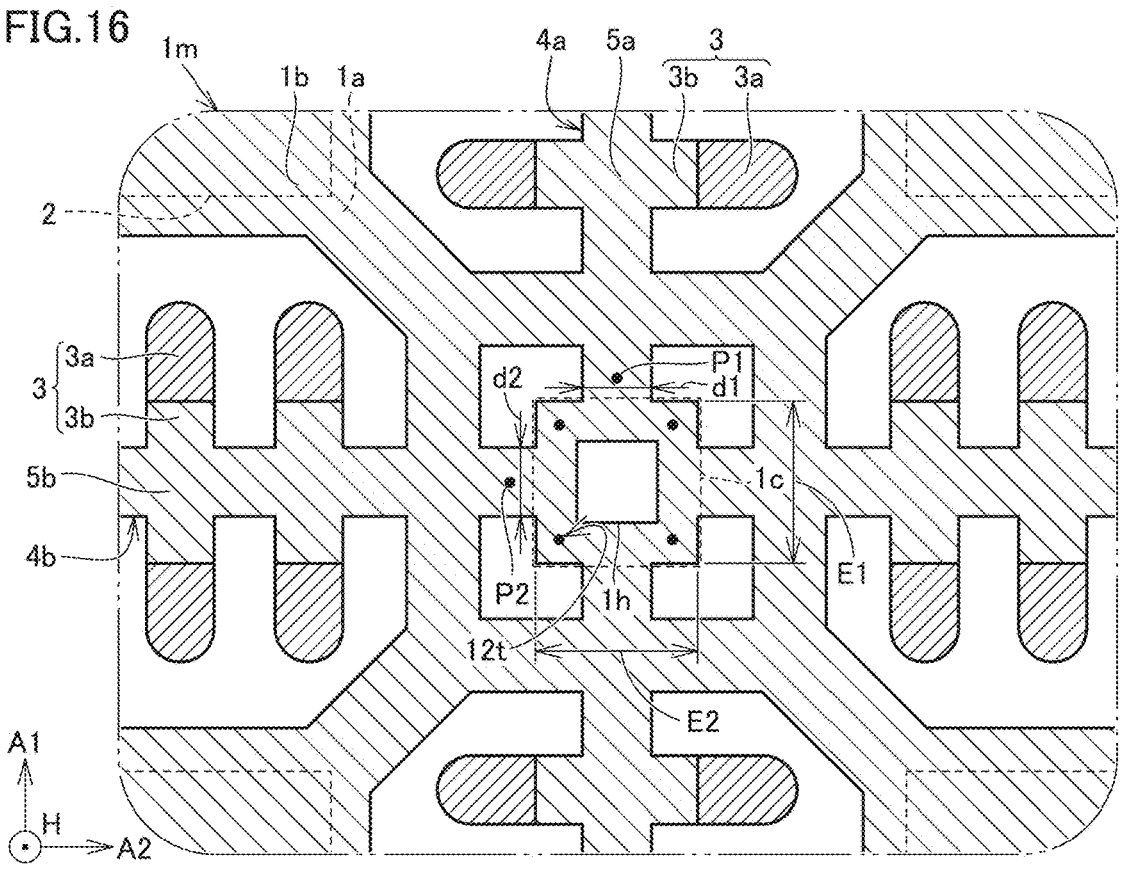
FIG. 16 is a plan view showing a configuration of a back surface 1*b* of a lead frame 1*m*, according to a variation of the embodiment.

FIG. 16 is a plan view showing a configuration of a back surface 1b of a lead frame 1m according to a variation of the embodiment. In the lead frame 1m, the multiple-irradiated region 1c is provided so as to form a hollow shape and no lead frame 1 is disposed in the hollow. In other words, the multiple-irradiated region 1c is formed in a hollow shape surrounding a hollow area 1h. Note that the variation and the above-described embodiment have in common with respect to the multiple-irradiated region 1c of the lead frame 1m as overlapping the corner regions 12t (portions to be the corner regions 12t) of the semiconductor device 12 as an end product.

The hollow area 1h is included in the scan regions R1 and R2 (see FIG. 4) of the laser light, and irradiated with the laser light in an overlapping manner. However, since the hollow area 1h is the portion that is removed from the lead frame by the full-cut process with the blade 13, that is, the portion that is not included in the semiconductor device 12 as an end product, the hollow area 1h is not affected by the hollow area 1h being irradiated with the laser light in the overlapping manner. Since the lead frame 1 is not present in the hollow area 1h in the full-cut process with the blade 13, the load on the blade 13 can be reduced.

While the embodiment of the present invention has been described above, the above disclosure is by way of example in all respects and is not limiting. The technical scope of the present invention is indicated by the appended claims, and all changes that come within the scope of the claims and the meaning and range of equivalency of the claims are intended to be embraced within their scope.

REFERENCE SIGNS LIST

1, 1m, 1z lead frame; 1a, 9a front surface; 1b back surface; 1c multiple-irradiated region; 1h hollow area; 2 die pad; 3 lead portion; 3a thicker portion; 3b thinner portion; 3t side surface; 4a tie bar portion (first tie bar portion); 4b tie bar portion (second tie bar portion); 5a first groove; 5b second groove; 6 semiconductor chip; 7 bonding wire; 8 protective film; 9 resin material; 10 plating layer; 11 resin molded product; 12 semiconductor device; 12t corner region; 13 blade; 14 land; 15 solder; A1 first direction; A2 second direction; DC1, DC2 score line; E1, E2, W2, W5, d1, d2 width; H thickness direction; L1, L2, L3 laser light; P1, P2 portion; R1, R2 scan region; and W1 groove width.

The invention claimed is:

1. A semiconductor device manufacturing method comprising:

a preparation step of preparing a lead frame having a front surface on which a semiconductor chip is mounted, and a back surface opposite the front surface, the back surface having a first groove extending in a first direction and a second groove extending in a second direction intersecting with the first direction;

a molding step of forming a resin molded product by sealing the lead frame and a plurality of semiconductor chips mounted on the lead frame with a resin material;

a first scan step of removing the resin material from the first groove by scanning laser light over the first groove in the first direction;

a second scan step of removing the resin material from the second groove by scanning laser light over the second groove in the second direction; and a cutting step of forming a plurality of unit resin molded products by cutting and singulating the resin molded product along the first groove and the second groove, wherein when the back surface of the lead frame is viewed in a direction perpendicular to the back surface, the back surface of the lead frame has a multiple-irradiated region that is irradiated with laser light scanned in the first scan step and laser light scanned in the second scan step, at least one of the plurality of unit resin molded products, formed in the cutting step, has a corner region located overlapping the multiple-irradiated region of the lead frame, and the multiple-irradiated region of the lead frame prevents laser light emitted to the back surface from reaching a portion of the resin material on the front surface of the lead frame, the portion being located at a position corresponding to the corner region.

2. The semiconductor device manufacturing method according to claim 1, wherein when the back surface of the lead frame is viewed in the direction perpendicular to the back surface, the lead frame prepared through the preparation step has:

a first tie bar portion extending in the first direction and having the back surface in which the first groove is formed; and a second tie bar portion extending in the second direction and having the back surface in which the second groove is formed, wherein the multiple-irradiated region is provided in an area where the first tie bar portion and the second tie bar portion intersect, a width of the multiple-irradiated region in the second direction is greater than a width, in the second direction, of a portion of the first tie bar portion that is connected to the multiple-irradiated region, and a width of the multiple-irradiated region in the first direction is greater than a width, in the first direction, of a portion of the second tie bar portion that is connected to the multiple-irradiated region.

3. The semiconductor device manufacturing method according to claim 2, wherein the multiple-irradiated region is provided so as to form a hollow shape and no lead frame is disposed therein.

4. A lead frame, having:

a front surface on which a semiconductor chip is mounted; and a back surface opposite the front surface, the back surface having a first groove extending in a first direction and a second groove extending in a second direction intersecting with the first direction, wherein the lead frame, together with a plurality of semiconductor chips mounted on the lead frame, is sealed with a resin material to form a resin molded product, the resin material is removed from the first groove by scanning laser light over the first groove in the first direction, the resin material is removed from the second groove by scanning laser light over the second groove in the second direction, and a plurality of unit resin molded products are formed by cutting and singulating the resin molded product along the first groove and the second groove, wherein when the back surface of the lead frame is viewed in a direction perpendicular to the back surface, the back surface has a multiple-irradiated region that is irradiated with laser light when the resin material is removed from the first groove by scanning laser light over the first groove along the first direction, and when the resin material is removed from the second groove by scanning laser light over the second groove along the second direction, wherein each of the plurality of unit resin molded products has a corner region located overlapping the multiple-irradiated region of the lead frame, and the multiple-irradiated region of the lead frame prevents laser light emitted to the back surface from reaching a portion of the resin material on the front surface of the lead frame, the portion being located at a position corresponding to the corner region.

5. The lead frame according to claim 4, wherein when the back surface of the lead frame is viewed in the direction perpendicular to the back surface, the lead frame has:

a first tie bar portion extending in the first direction and having the back surface in which the first groove is formed; and a second tie bar portion extending in the second direction and having the back surface in which the second groove is formed, wherein the multiple-irradiated region is provided in an area where the first tie bar portion and the second tie bar portion intersect, a width of the multiple-irradiated region in the second direction is greater than a width, in the second direction, of a portion of the first tie bar portion that is connected to the multiple-irradiated region, and a width of the multiple-irradiated region in the first direction is greater than a width, in the first direction, of a portion of the second tie bar portion that is connected to the multiple-irradiated region.

6. The lead frame according to claim 5, wherein the multiple-irradiated region is provided so as to form a hollow shape, and no lead frame is disposed therein.

* * * * *